(12) United States Patent
Rostaing et al.

(10) Patent No.: US 9,297,911 B2
(45) Date of Patent: Mar. 29, 2016

(54) DEVICE FOR CONVERTING CURRENT PULSES INTO VOLTAGE PULSES

(71) Applicant: COMMISSARIAT A L'ENERGIE ATOMIQUE ET AUX ENE ALT, Paris (FR)

(72) Inventors: Jean-Pierre Rostaing, La Cote Saint-Andre (FR); Patrice Ouvrier-Buffet, Saint-Jorioz (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 14/350,683

(22) PCT Filed: Oct. 4, 2012

(86) PCT No.: PCT/EP2012/069585
§ 371 (c)(1),
(2) Date: Apr. 9, 2014

(87) PCT Pub. No.: WO2013/034779
PCT Pub. Date: Mar. 14, 2013

(65) Prior Publication Data
US 2014/0264050 A1    Sep. 18, 2014

(30) Foreign Application Priority Data

Oct. 10, 2011 (FR) ..................... 11 59122

(51) Int. Cl.
*G01T 1/24* (2006.01)
*H03H 11/26* (2006.01)
*H03H 19/00* (2006.01)
*H03F 3/00* (2006.01)
*G01V 5/00* (2006.01)
*H02M 11/00* (2006.01)

(52) U.S. Cl.
CPC .............. *G01T 1/247* (2013.01); *G01V 5/0008* (2013.01); *H02M 11/00* (2013.01); *H03F 3/005* (2013.01); *H03H 11/265* (2013.01); *H03H 19/00* (2013.01)

(58) Field of Classification Search
CPC ........... G01T 1/17; G01T 1/171; G01T 1/026; G01T 1/247; G01T 1/24; H02M 3/33523
USPC ........ 250/371, 370.01, 370.09, 336.1, 214 R; 250/370.07, 214 A; 327/103, 514; 378/91; 330/308
See application file for complete search history.

(56) References Cited

U.S. PATENT DOCUMENTS 2,835,876 A * 5/1958 Hammond ..................... 336/134
2,999,208 A * 9/1961 Ruehlemann ................. 361/199
3,528,749 A * 9/1970 Bowker ......................... 356/433

(Continued)

OTHER PUBLICATIONS

International Search Report Issued Dec. 6, 2012 in PCT/EP12/069585 Filed Oct. 4, 2012.

*Primary Examiner* — David Porta
*Assistant Examiner* — Blake Riddick
(74) *Attorney, Agent, or Firm* — Oblon, McClelland, Maier & Neustadt, L.L.P.

(57) ABSTRACT

An electronic device to simply and efficiently measure energy of incident photons in a very short time and with a very high count rate and high precision, starting from current pulses from an ionizing electromagnetic radiation detector, the electronic device including an analog delay line with switched capacitors with controlled loss at an output from a charge preamplifier.

18 Claims, 6 Drawing Sheets

(56) References Cited

U.S. PATENT DOCUMENTS

| | | | |
|---|---|---|---|
| 4,156,940 A * | 5/1979 | Hollingsworth et al. | 365/189.09 |
| 5,453,710 A | 9/1995 | Gilbert et al. | |
| 5,804,997 A * | 9/1998 | Nishizono | H03F 3/087 327/103 |
| 5,815,012 A * | 9/1998 | Rivoir et al. | 327/103 |
| 5,936,457 A * | 8/1999 | Liao | G01S 3/783 250/214 R |
| 6,323,513 B1 * | 11/2001 | Schindler | H01L 27/11502 257/295 |
| 7,436,165 B2 * | 10/2008 | Ouvrier-Buffet et al. | 324/76.11 |
| 7,550,733 B2 * | 6/2009 | Endo et al. | 250/370.09 |
| 2004/0027175 A1 | 2/2004 | Chambaud et al. | 327/103 |
| 2004/0239378 A1 * | 12/2004 | Bogner | G11C 27/026 327/94 |
| 2006/0118841 A1 * | 6/2006 | Eliason | H01L 27/11502 257/295 |
| 2007/0051875 A1 * | 3/2007 | Chen et al. | 250/214 R |
| 2008/0099689 A1 * | 5/2008 | Nygard et al. | 250/370.09 |
| 2008/0218221 A1 * | 9/2008 | Yen et al. | 327/103 |
| 2009/0040806 A1 * | 2/2009 | Albasini | G11B 9/02 365/145 |
| 2009/0096489 A1 * | 4/2009 | Ying et al. | 327/103 |
| 2010/0040195 A1 * | 2/2010 | Naydenov et al. | 378/28 |
| 2010/0107027 A1 * | 4/2010 | Tsutsumi et al. | 714/747 |
| 2010/0172467 A1 * | 7/2010 | Steadman Booker | G01T 1/17 378/19 |
| 2011/0001519 A1 * | 1/2011 | Audebert | H03F 3/005 327/103 |
| 2011/0025418 A1 * | 2/2011 | Aram | H03F 1/26 330/253 |
| 2011/0098980 A1 | 4/2011 | Ouvrier-Buffet et al. | |

* cited by examiner

DEVICE FOR CONVERTING CURRENT PULSES INTO VOLTAGE PULSES

TECHNICAL FIELD

The invention relates to a device for conversion of current pulses into voltage pulses that can be used particularly in a system for detection of ionising electromagnetic radiation.

STATE OF PRIOR ART

FIG. 1 shows a system for detection of ionising electromagnetic radiation. Such a system is usually composed of a semiconductor detector 1 that receives incident photons ph, a charge preamplifier 2 measuring the signal output by the detector 1, electronic processing 3 that processes the signal output by the electronic circuit 2 and an analogue-digital conversion circuit 4 that digitises signals output by the electronic system 3 in order to obtain the histogram of these signals. The energy spectrum of received incident photons ph can be obtained from this histogram.

A system for detection of ionising electromagnetic radiation must firstly have a high energy resolution and secondly a high detection efficiency.

Semiconductor detectors satisfy these two criteria. The advantages of using semiconductors for the detection of electromagnetic radiation are disclosed in patent application FR 2951037, filed by the same applicant. When semiconductor detectors are submitted to intense radiation, they produce a very large number of pulses per unit time. Thus, ionising electromagnetic radiation detection systems that use semiconductor detectors must have a fast spectrometry system with a high count rate.

It is usually considered that a high count rate is more than about 100 000 photons detected per second (or hits per second).

The highest performance low noise charge preamplifiers use a current integrator. FIG. 2 shows such an assembly associated with the semiconductor detector 1.

The detector 1 comprises an element made of a semiconductor material M and a resistor R that connects the element M to a high voltage HV. The current integrator circuit comprises a capacitor C1, an amplifier A1, a capacitor Cint and a resistor Rp. The capacitor C1 is mounted on the inverting input of the amplifier A1 and the capacitor Cint and the resistor Rp are mounted in parallel between the inverting input and the output from the amplifier A1.

Diagrammatically, when a photon penetrates in the semiconductor element M with sufficient energy, it can create carriers in the material. The semiconductor element M then produces a detection current i(t) during the detection time of the photon ph. More precisely, a current pulse is generated for each photon ph absorbed with a sufficient energy.

The charge preamplifier is mounted at the output from the detector 1 and it receives the current i(t) and produces the voltage Vout (t) in response, given by:

$$Vout(t) = -\frac{1}{Cint} \cdot \int i(t)dt = -Q/Cint$$

where Q is the quantity of charge produced by the photon ph interacting with the semiconductor material.

The voltage Vout(t) at the output from the charge amplifier in the form of voltage pulses is intermittent because the preamplifier discharges through the capacitor Cint. This voltage Vout (t) therefore has to be saved quickly after disappearance of the detection current i(t). At the same time, relaxation of the charge preamplifier can compensate for high count rates because its output voltage cancels out and the preamplifier would be quickly saturated if there were no relaxation.

The voltage Vout(t) output by the electronic circuit 2 corresponds to the input voltage to the electronic processing circuit 3.

Patent application FR2951037 discloses a processing circuit 3 comprising a delay line Lr so that high count rates can be achieved.

A diagram of such an electronic circuit is shown in FIG. 3.

The output Vout(t) from the charge preamplifier 2 is directly connected to an assembly composed of a delay line Lr, an attenuator Att (gain less than 1), a subtractor D, and an amplifier A2. The output from the amplifier A2 is directly connected to the analogue-digital conversion circuit 4. The delay line Lr, mounted in series with the attenuator Att has a first terminal connected to the output from the charge preamplifier and a second terminal connected to the negative input to the subtractor D. The positive input to the subtractor D is directly connected to the output from the charge preamplifier.

As a result of this arrangement, the signal Vout(t) output from the charge preamplifier is delayed by the delay line by a delay $\Delta$. The delay $\Delta$ is chosen to be longer than the rise time of the signal Vout(t) so that the output from the subtractor consists of a pulse with the same amplitude as the input pulse without changing the energy information.

FIG. 4 shows the variation in the output voltage from the charge preamplifier vout(t) as a function of time, with the output voltage from the delay line voutlar(t) and the output voltage from the amplifier A2, E(t).

The subtractor D subtracts the delayed voltage Voutlar(t) from the voltage Vout(t). The signal vsub(t)=voutpa(t)−voutlar(t) resulting from this subtraction is then amplified by the amplifier A2. This amplifier then outputs a voltage pulse E(t) with a height proportional to the pulse produced at the detector terminals, in other words the energy transferred by the photon ph to the semiconductor material.

This voltage pulse E(t) is then digitised by an analogue-digital converter 4. The digital values thus obtained are supplied to a computer programmed to identify energy values higher than a predetermined energy threshold. Once the energy values have been identified, an algorithm calculates the corresponding photon energy values.

It can be understood that the device composed of the charge preamplifier 2 and the processing circuit 3 forms a device for conversion of current pulses into voltage pulses.

With the use of semiconductor detectors, the count rates can be higher than 10 million incident photons per second, which requires the construction of an appropriate device for conversion of current pulses into voltage pulses.

Like the charge transfer delay lines, the delay lines Lr integrated into devices for conversion of current pulses into voltage pulses are not adapted to such count rates.

They have a low signal to noise ratio and a high sensitivity to technological dispersions and the environment.

Furthermore, implementation of such delay lines in a device for conversion of current pulses into voltage pulses requires the use of an attenuator Att like that shown in FIG. 3.

The function of the attenuator Att is to compensate for the pole of the charge preamplifier.

When the pole of the charge preamplifier 2 is not compensated, the amplitude of signal vsub(t) has an offset for each current pulse received by the charge preamplifier 2.

This phenomenon is cumulative when the pulses are close together, particularly for high count rates. Accumulation of offsets tends to saturate and therefore to paralyse the device for conversion of current pulses into voltage pulses, and therefore the ionising electromagnetic radiation detection system.

The pole of the charge preamplifier is compensated when the gain of the attenuator Att is equal to $G=e^{-\Delta/R_p C_{int}}$. Considering the calculation of the exponential term, this gain that is usually between 0.995 and 0.999, is difficult to adjust and such an attenuator can be difficult to make in practice. Therefore delay lines like those presented in patent application FR2951037 are unsuitable for very high count rates.

The purpose of this invention is to disclose a device for conversion of current pulses into voltage pulses that operates at very high frequency.

A subsidiary purpose of this invention is to disclose a semiconductor electromagnetic radiation detector with a high count rate and high precision.

PRESENTATION OF THE INVENTION

This objective is achieved by this invention that is defined by a device for conversion of current pulses into voltage pulses comprising:
  an integrator circuit comprising a first capacitor and a first resistor placed in parallel between the output and the inverting input of an operational amplifier, said inverting input to said operational amplifier receiving said current pulses;
  a delay line receiving said output from said integrator circuit and generating a delay;
  a subtractor circuit receiving said output from the integrator circuit on a positive terminal and the output from said delay line on a negative terminal;
characterised in that said delay line comprises at least one memory cell, said memory cell comprising:
  a first and a second switch in series between said input and said output of said delay line, said first switch being connected to said output from integrator circuit and said second switch being connected to said negative terminal of said subtractor circuit;
  a second capacitor placed between the common node of the two switches and a first reference potential; and
  a second resistor placed between the common node of said second capacitor (Ce) and said second switch and placed at a second reference potential; and
the product of said first resistor and said first capacitor being equal to the product of said second resistor and said second capacitor.

This device also comprises logical means capable of sending to each of the memory cells in sequence, a first signal to the first switch to make it conducting and a second signal to the second switch to make it conducting, the second signal being offset in time from the first signal and the time offset being defined as a function of the chosen delay.

Advantageously, the second reference potential is equal to the continuous potential of said inverting input to said operational amplifier.

The delay is chosen to be longer than the rise time of the signal at the output from the integrator circuit.

This device for conversion of current pulses into voltage pulses can be integrated into an application specific integrated circuit (ASIC). Advantageously, the device is made using a CMOS technology.

The invention also relates to a system for detection of ionising electromagnetic radiation, characterised in that it comprises an ionising electromagnetic radiation detector capable of receiving incident photons and emitting current pulses at its output, a device for conversion of current pulses into voltage pulses according to any one of the previous claims, connected to the output from said detector, and a digital-analogue converter at the output from said device for conversion of current pulses into voltage pulses.

The ionising electromagnetic radiation detector may be a semiconductor detector.

Finally, the ionising electromagnetic radiation detection system according to the invention may be used for the detection of explosives in luggage.

BRIEF DESCRIPTION OF THE DRAWINGS

Other characteristics and advantages of the invention will become clear after reading a preferred embodiment of the invention with reference to the attached figures among which.

DETAILED PRESENTATION OF PARTICULAR EMBODIMENTS

Figure 1:
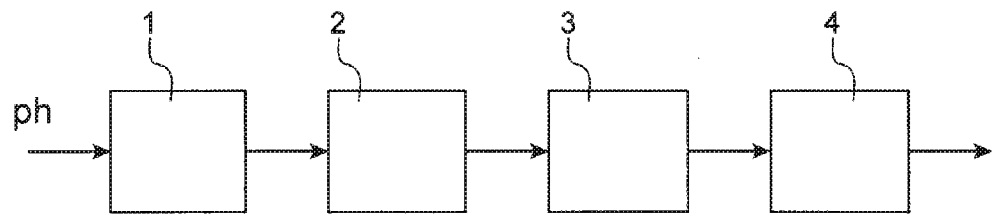
FIG. 1 shows a block diagram of a commonly used system for detection of a ionising electromagnetic radiation according to the state of the art.
Figure 2:
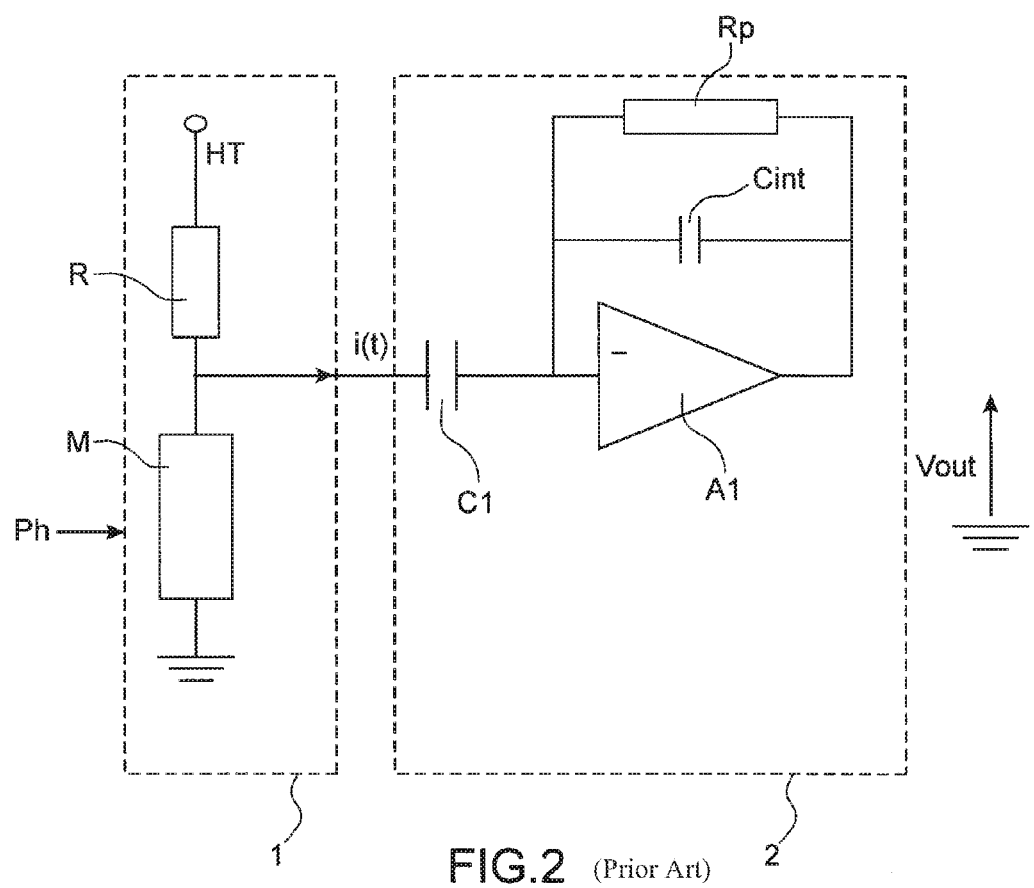
FIG. 2 shows the assembly of a charge preamplifier associated with a radiation detector in the ionising electromagnetic radiation detection system in FIG. 1.
Figure 3:
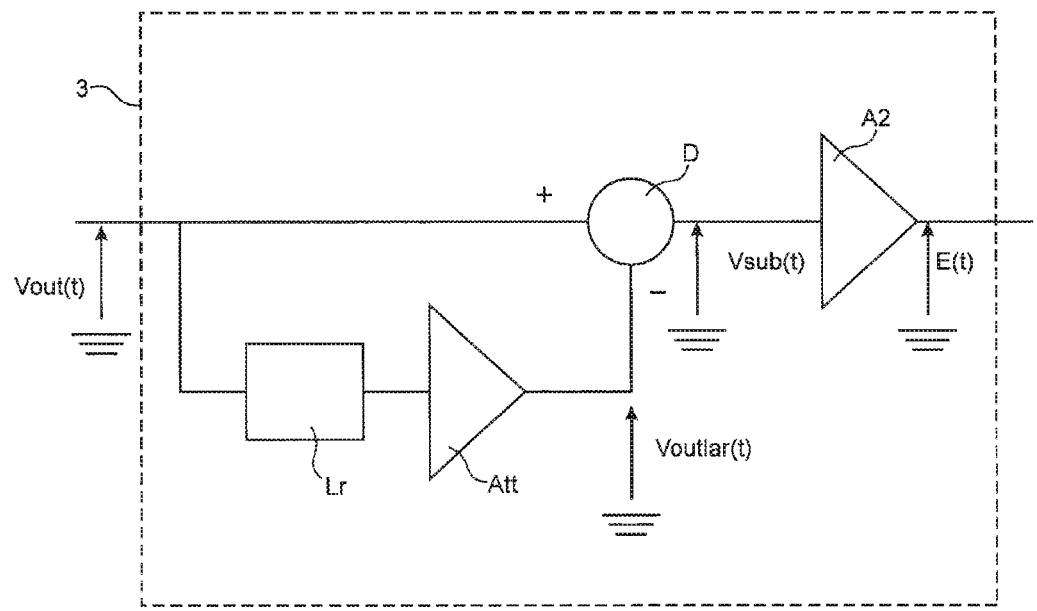
FIG. 3 shows a diagram of an electronic processing circuit in the detection system in FIG. 1.
Figure 4:
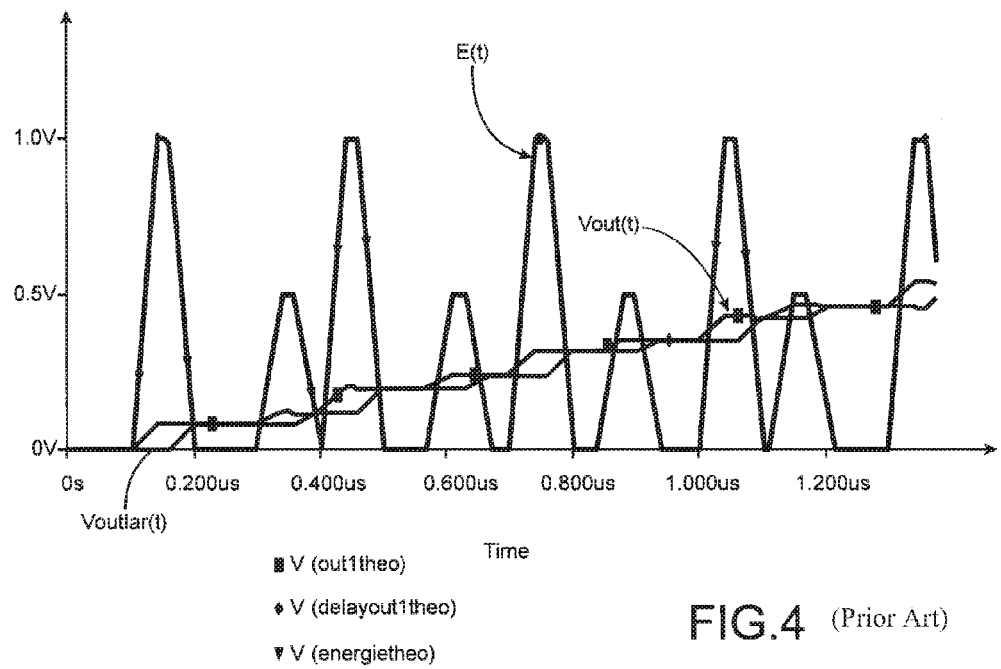
FIG. 4 shows the variation of the output voltage from the charge preamplifier in FIG. 2 and the output from the processing circuit in FIG. 3, as a function of time.
Figure 5A:
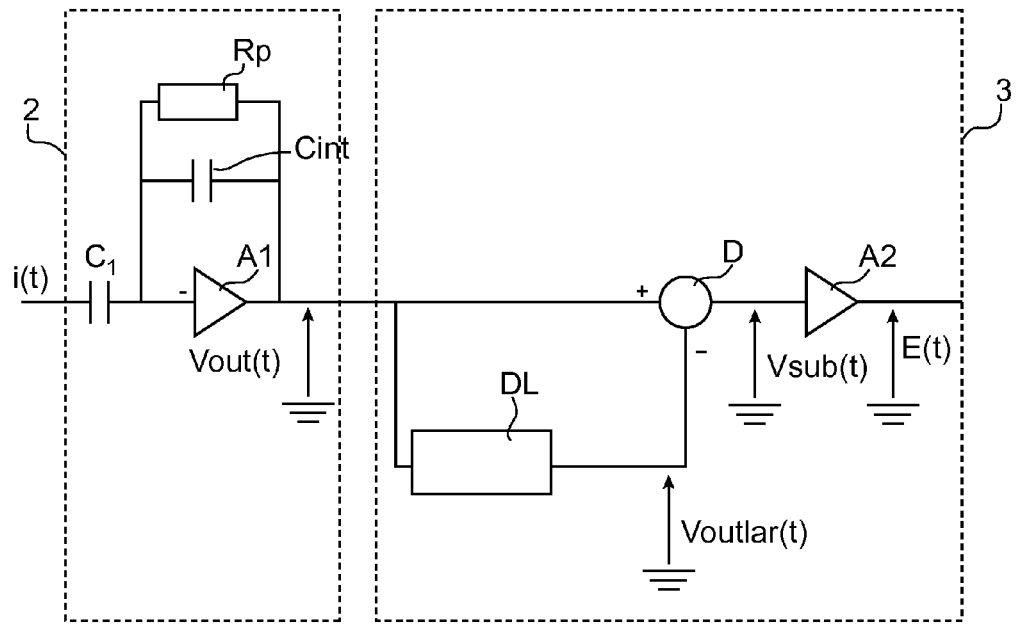
FIG. 5A shows a diagram of the device for conversion of current pulses into voltage pulses according to a first embodiment of the invention.

FIG. 5A shows a diagram of the device for conversion of current pulses into voltage pulses according to a first embodiment of the invention. The device comprises a charge preamplifier 2 and electronic processing 3.

The device in FIG. 5A comprises a charge preamplifier 2 mounted as integrator. The current integrator circuit comprises a capacitor C1, an amplifier A1, a capacitor Cint and a resistor Rp. The capacitor C1 is mounted on the inverting input of the amplifier A1 and the capacitor Cint and the resistor Rp are mounted in parallel between the inverting input and the output of the amplifier A1.

In response to a current pulse i(t), the charge preamplifier 2 produces a voltage pulse Vout(t). The output from the charge preamplifier 2 is directly connected to an assembly composed of a delay line DL, subtraction means D, and an amplifier A2.

The delay line DL has a first terminal connected to the output from the charge preamplifier 2 and a second terminal connected to the negative input to subtraction means D. The positive input to the subtraction means D is directly connected to the output from the charge preamplifier 2. The subtraction means D may for example be made in the form of a differential amplifier, in a manner known in itself.

The device according to the invention is remarkable in that it comprises a controlled loss delay line DL, made using N switched capacitors where N≥1, and N resistive elements mounted respectively in N parallel stages. The N capacitors, switched sequentially and cyclically, form a memory of N successive samples of the signal.

As will be described later, the device is self-adaptive in the sense that it automatically adapts itself to the delay of the line used due to the presence of resistive elements.

Figure 5B:
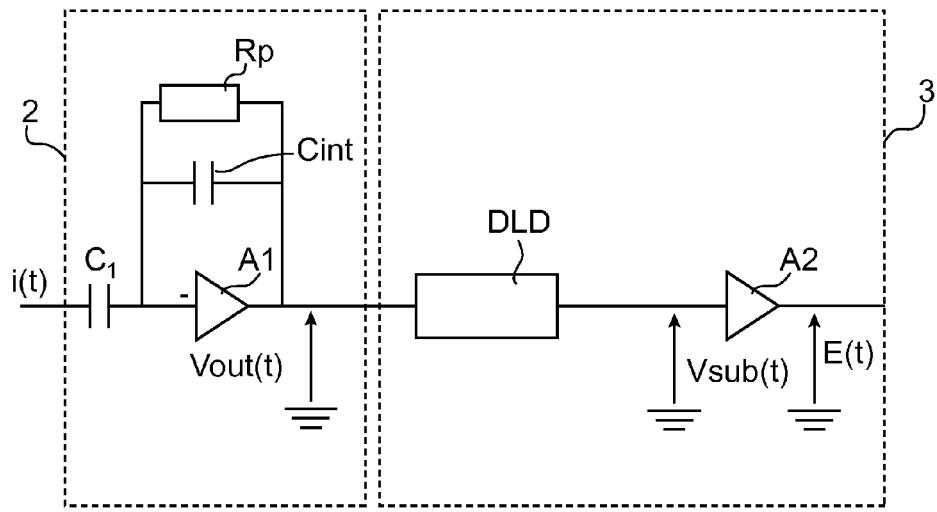
FIG. 5B shows a diagram of the device for conversion of current pulses into voltage pulses according to a second embodiment of the invention.

FIG. 5B shows a diagram of the device for conversion of current pulses into voltage pulses according to a second embodiment of the invention. Elements with the same reference signs as FIG. 5A are identical to those described above.

The pulse conversion device shown in FIG. 5B is different from that in FIG. 5A in that it comprises a delay line DLD including subtraction means, as explained later with relation to FIG. 6B. The output S from the delay line DLD is connected directly to the input to amplifier A2.

In the same way as in the first embodiment, the delay line DLD is a controlled loss line and is made by means of N switched capacitors where N≥1, and N resistive elements mounted respectively in N parallel stages, the N capacitors switched sequentially and cyclically once again forming a memory of N successive samples of the signal.

Figure 6A:
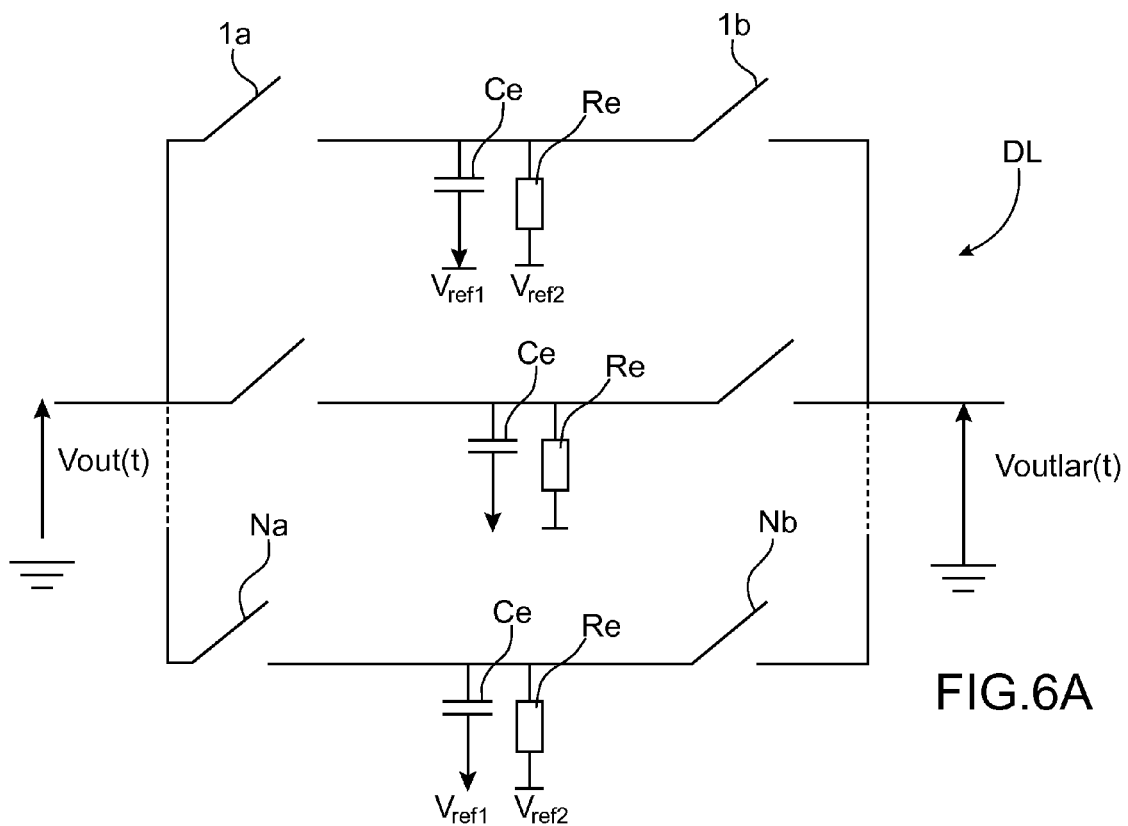
FIG. 6A shows a block diagram of the analogue delay line with switched capacitors, integrated into the conversion device in FIG. 5A.

FIG. 6A contains a block diagram of one embodiment of the delay line DL used in FIG. 5A. The delay line DL is made by putting N stages in parallel each comprising an elementary memory cell.

The delay line DL receives the signal Vout(t) from the charge preamplifier 2 as input and produces a delayed signal Voutlar(t).

Each elementary memory cell is composed of a first switch $1a, 2a, \ldots Na$ and a second switch $1b, 2b, \ldots Nb$ in series between the input and output of the delay line, a capacitor Ce placed between the common node of the two switches and a first reference potential Vref1. Furthermore, a resistor Re is placed between the common node of the two switches and a second reference potential Vref2. The result is thus a Switched Capacitors Analogue Delay Line (LARACC).

It will be understood that the delay of the delay line is essentially provided by the difference between the switching times of switches $1a$ and $1b$, $2a$ and $2b$, ..., Na and Nb.

A distinction will be made between write switches $1a, 2a, \ldots Na$ connected to the output of the integrator circuit 2 and read switches $1b, 2b, \ldots Nb$ connected to a first input to the subtractor D.

The memory cells are identical. Thus, the value of the resistor and the value of the capacitor are the same for each memory cell.

In each memory cell, the resistor Re acts as a discharge element of the capacitor Ce. Re is chosen such that the time constant Re.Ce is the same as Rp.Cint, in other words the discharge rate of the capacitor Ce is the same as the discharge rate of the capacitor Cint. The pole of the charge preamplifier 2 is then compensated and the conversion device automatically adapts to the delay regardless of what delay is chosen, provided that it is greater than the rise time of the signal Vout(t). The presence of an attenuator in the delay loop is therefore no longer necessary. In each memory cell, the resistor Re is located between the node common to the capacitor Ce and to the read switch. It is also connected to a second reference potential Vref2. The resistor Re is designed to simply and efficiently compensate the charge preamplifier pole.

More precisely, the operation and choice of the resistor Re will be described considering the operation of a single memory cell according to the invention. It will be understood that this example can be generalised to other memory cells in the case in which N>1.

When the write switch of the memory cell is closed, the memory cell receives the voltage Vout(t). The capacitor Ce charges.

When the write switch of the memory cell opens, in other words at the time that the sample is taken, the capacitor Ce begins to discharge through Re.

It is necessary that the voltage memorised on the capacitor Ce at the time of the read has lost the same quantity as that at the terminals of the capacitor Cint, in order to compensate for the pole of the charge preamplifier 2.

Therefore, the capacitor Ce must be discharged with the same time constant τ. This condition is satisfied when Rp.Cint=Re.Ce.

Advantageously, firstly the components Rp and Re, and secondly the components Cint and Ce, will be matched to overcome technological and environmental variations.

In one preferred embodiment of the invention, the potential Vref2 is made to be the same continuous potential as the inverting input to the charge preamplifier 2. This can be done by connecting the electrode of Re that is not connected to the common node to the capacitor Ce and the read switch, to an operational amplifier looped back on itself. This prevents the circulation of a permanent current that distorts charges and discharges of the capacitors. The advantage of this characteristic appears at high rates.

Figure 6B:
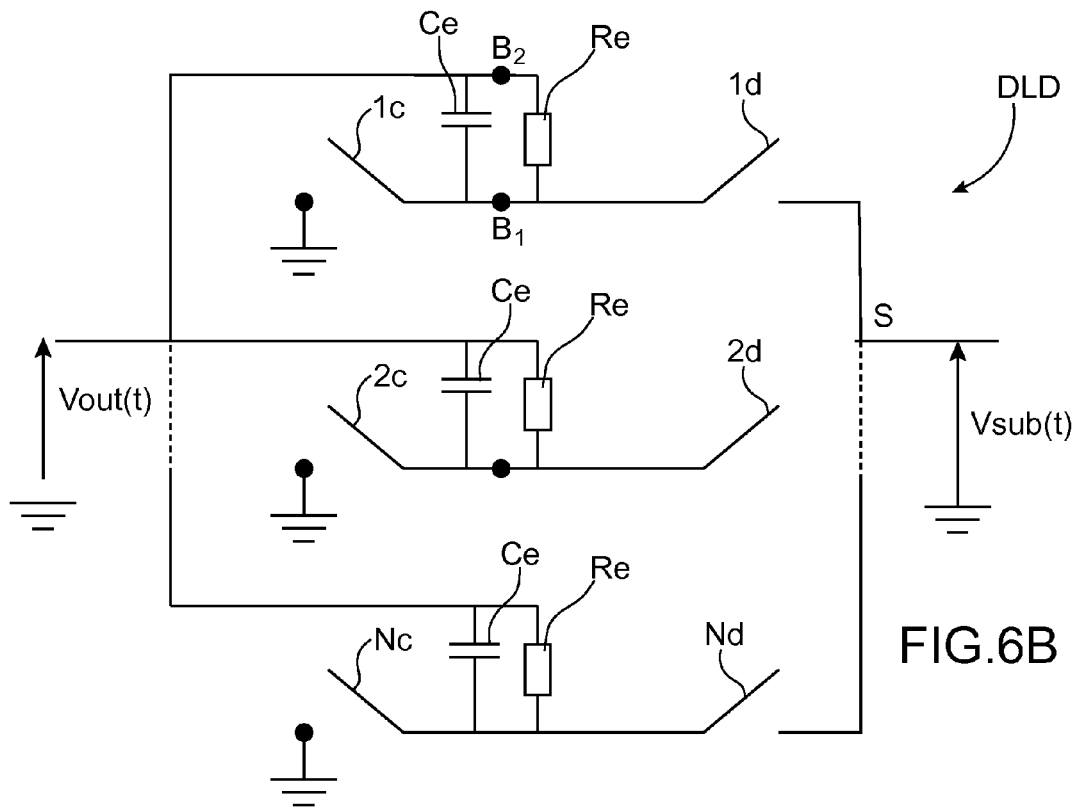
FIG. 6B shows a block diagram of the analogue delay line with switched capacitors, integrated into the conversion device in FIG. 5B.

FIG. 6B shows a block diagram of an embodiment of the delay line DLD used in FIG. 5B. The delay line DLD is made by putting N≥1 stages in parallel, with each stage comprising one elementary memory cell.

More precisely, each elementary memory cell comprises a capacitor Ce mounted in parallel with a resistor Re between a first common node B1 and a second common node B2. The values of Re and Ce are chosen such that Rp.Cint=Re.Ce.

Each memory cell is also equipped with a write switch and a read switch. Write switches of the different cells are indicated as $1c, 2c, \ldots Nc$ and read switches are indicated as $1d, 2d, \ldots, Nd$.

For each cell, the first common node (B1) is connected firstly to a write switch ($1c, \ldots, Nc$) and secondly to a read switch ($1d, \ldots, Nd$). The second common node (B2) of the cell is connected to the output from the charge preamplifier 2. The write switch, when it is conducting, connects the first common node to the ground. The read switch, when it is conducting, connects the first common node B1 to the output S from the delay line.

It will be noted that the second common nodes B2 of the different elementary cells are all connected directly to the output from charge preamplifier 2, while the first common nodes of the different elementary cells are connected through their corresponding read switches to the output S from the delay line DLD.

In a step in which the elementary cell is written, the write switch is made conducting and the read switch is put into a high impedance state. The capacitor Ce then charges at a voltage $V_{out}(t_1)$ where $t_1$ is the end of the write step.

When the write switch opens, the memory cell is disconnected from the output from the charge preamplifier 2 and from the output S. The capacitor Ce then discharges very slowly through the resistor Re with the same constant τ as the charge preamplifier. Let the voltage remaining between the terminals of the capacitor be $V_C(t)$, the voltage on the second common terminal is equal to $V_{out}(t)-V_C(t)$, in other words approximately equal to $V_{out}(t)-V_{out}(t_1)$ due to the discharge loss, where $V_{out}(t)$ is the instantaneous voltage at the output from the charge preamplifier.

In a read step, the read switch is made conducting while the write switch remains in high impedance. The voltage on the output S is then equal to $V_{out}(t_2)-V_{out}(t_1)$ where $t_2$ is the read time.

The particular set up of the memory cell can directly give the difference in voltage $V_{out}(t_2)-V_{out}(t_1)$ in the read step, the change of the write switch to high impedance forcing subtraction of the memorised voltage $V_{out}(t_1)$ from the input voltage $V_{out}(t)$.

Figure 7:
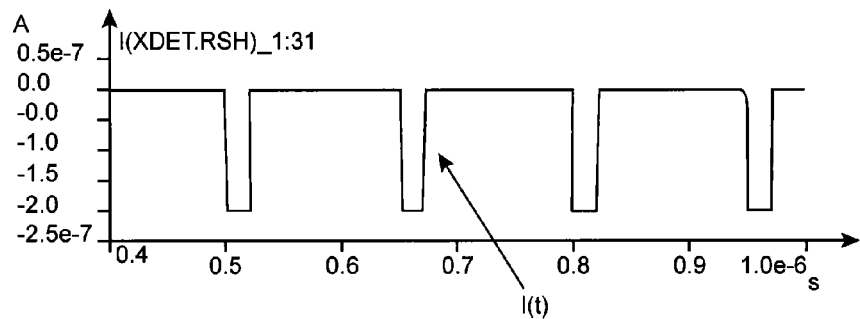
FIG. 7 shows signals obtained at the output from the two devices for conversion of current pulses into voltage pulses shown in FIG. 5A.
Figure 7:
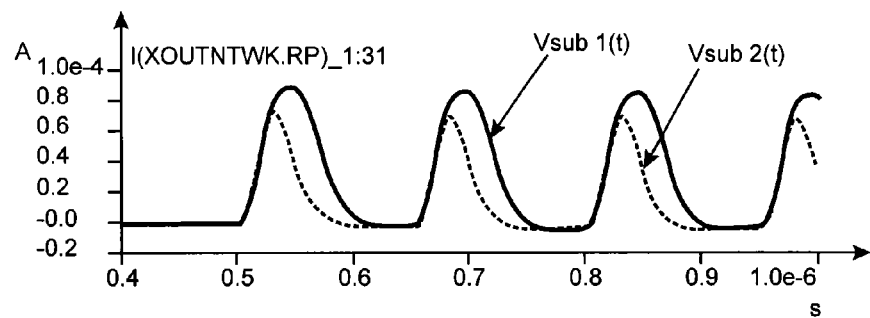

FIG. 7 shows signals obtained at the output from two devices for conversion of current pulses into voltage pulses according to FIG. 5A.

In response to a pulse i(t), the first device for conversion of current pulses into voltage pulses produces a signal vsub1($t$) and the second device for conversion of current pulses into voltage pulses produces a signal vsub2($t$).

These signals, vsub1($t$) and vsub2($t$), measured by an oscilloscope, do not have any offsets after each pulse, even when the pulses are close. Saturation of the device for conversion of current pulses into voltage pulses is thus avoided and therefore the measurement of the energy of photons ph received by the detector 1 is extremely precise.

Another advantage of the design of the delay line DL as shown in FIG. 5A, is that it avoids degradation of the signal because there is no charge transfer between the memory cells, which is contrary to the operating principle of technologies used in prior art such as bucket-brigade device (BBD) delay lines.

Therefore the delay line DL according to the invention is a controlled loss delay line adaptable in a device for conversion of current pulses into voltage pulses in which the frequency at which current pulses appear is very high.

Operation of the delay line DL will now be described with reference to FIG. 5A and FIG. 6. Those skilled in the art will understand that operation of the delay line DLD is identical and therefore a separate description will not be made herein.

The delay line DL may be made with a single elementary memory cell, in other words N=1.

However preferably, the signal will oversampled in order to increase the signal to noise ratio.

The basic operating principle of the delay line DL is that the sampling of the delayed signal is obtained by reading the signal with a delay after the writing.

The write is made on the capacitor Ce of the first memory cell during a period θ1 during which the write switch 1a is conducting and the other write switches are open, on the capacitor Ce of the second memory cell for a period θ2 during which the write switch 2a is conducting and the other write switches are open, and so on to the Nth capacitor. The cycle is then complete and begins again with the capacitor 1.

Each period θ1, θ2, ..., θN does not overlap with previous and subsequent periods in order to prevent any conflict between memory cells.

The read exactly follows the same process as the write. Thus, read is made with the discharge of the capacitor Ce of the first memory cell for a period θ1' during which the read switch 1b is conducting and the other write switches are open, with the discharge of the capacitor Ce of the second memory cell during a period θ2' during which the read switch 2b is conducting and the other read switches are open, and so on until the Nth capacitor. The cycle is then complete and begins again with the capacitor 1.

Each period θ1', θ2', ... θN', does not overlap with previous and subsequent periods so as to prevent any conflict between memory cells.

For a particular elementary cell, the period during which the read switch is conducting is offset in time from the period during which the write switch is conducting, by a time offset denoted x. Therefore read switches are switched sequentially after the write switches.

The periods are controlled as follows:

A sequencer generates $2^n$ non-overlapping phases with duration Tck. Each control phase is delayed from the previous by a delay equal to Tck. The delay Tck is derived from a frequency clock fck, for example a quartz clock.

The counter may for example be an n-bit binary counter with which an n-to-$2^n$ decoder is associated.

Advantageously, n will be chosen such that $2^n$=N so as to apply a simple binary logic. This equality is used in the remainder of this description. It can then be understood that the time offset x can be between 1 and N periods.

The counter is advantageously synchronous because the system according to the invention is designed to operate at high frequency.

The sequencer consists of a counter connected to a time base, a decoder at the output from the counter and flop-flops RS at the output from the decoder.

The flip-flops RS ensure that the $2^n$ phases do not overlap. The chronology of the control periods will now be described with reference to FIG. 9, that shows a delay line DL according to FIG. 6 in which N=4.

Figure 8:
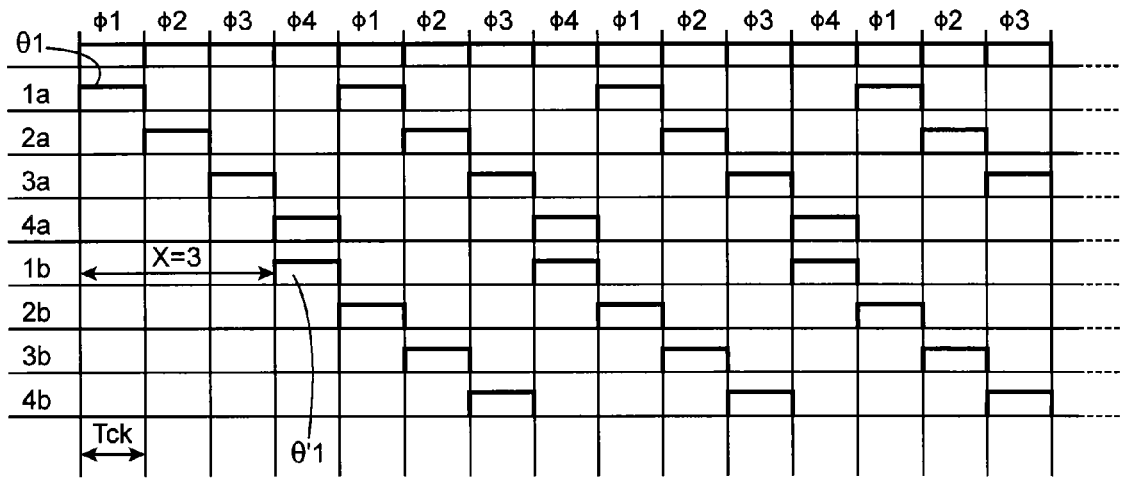
FIG. 8 shows a time diagram of control signals of the pulse conversion device according to FIG. 5A.

This line comprises 4 write switches 1a,2a,3a,4a and 4 read switches 1b,2b,3b,4b. The time diagrams represented in FIG. 8 show the variation of read and write switches as a function of a conversion cycle.

For the first elementary cell, the period θ1 during which the write switch 1a is conducting is equal to Tck. The beginning of the period θ1 corresponds to the rising edge of the first clock phase φ1 and the end of the period θ1 corresponds to the falling edge of the first clock phase [1]. This principle is valid for the other 3 elementary cells.

For the first elementary cell, the period θ1' during which the read switch 1b is conducting is equal to Tck and the beginning of the period θ1' corresponds to the rising edge of the first clock phase φ1 offset by 3 periods in this example. The end of the period θ1' corresponds to the falling edge of the first clock phase φ1 offset by 3 periods. This principle is valid for the other 3 elementary cells.

In the conversion device according to the invention, the value of the time offset x may be obtained by switching delayed clock phases on read switches. Therefore, the value x is dependent on the frequency fck of the clock and the chosen switching. Clock phases are switched using a switching circuit.

Advantageously, this switching circuit is controllable in order to vary the value of the offset x.

The sequencer, the clock and the switching circuit form logical control means for the conversion device according to the invention.

The delay Δ generated by the delay line DL corresponds to the addition of a fixed propagation time equal to about 5 ns+/−1 ns and the time offset x between write and read of the delay line DL.

Therefore, the delay is defined by the following formula:

$$\Delta = tpd + x$$

where tpd is the propagation time equal to 5 ns+−1 ns, and x is the time offset.

The delay can be adjusted in this manner by changing the clock frequency fck and/or controlling the switching circuit.

The delay Δ is necessarily greater than the rise time of the signal Vout(t) in order to have a pulse of the same amplitude as the input pulse at the output from the subtractor, without altering the energy information.

The conversion device as shown in FIG. 5A (or FIG. 5B) may be made in discrete electronics with COTS components.

Advantageously, a continuous time filter may be placed at the output from the delay line DL (or DLD). This continuous time filter, for example of the Butterworth or Chebychev type, can further reduce switching noise.

Preferably, the device according to the invention can be integrated in microelectronics and the device is adapted to microelectronic integration in a CMOS technology that has the advantage of being inexpensive and obtaining devices with remarkable performances, particularly in terms of electricity consumption.

Switches are preferably MOSFET transistors, and in this case the increase in the value of the capacitor Ce can reduce noise in kT/C.

Preferably, a layout using a 0.35 μm current CMOS technology will be chosen. When made using such a technology, the device can then be integrated into an ASIC (Application Specific Integrated Circuit).

The device can then satisfy the following constraints:
- size consistent with microelectronic integration, in other words smaller than 1 mm²;
- low sensitivity to technological variations to limit dispersions from one circuit to another;
- low sensitivity to environmental variations (temperature, power supply voltage, etc.);
- low noise, of the order of 100 μV max;
- high dynamics, of the order 1V;
- low consumption, of the order of 20 mW maximum.

Preferably, the logical means of controlling switching of switches are implemented in the ASIC. The clock is external to the ASIC circuit on which the device for conversion of current pulses into voltage pulses is located.

We will now describe one example embodiment of the device according to FIG. 5A. In this example, the delay line DL is composed of 16 capacitors and a 4-bit synchronous counter piloted by a clock with period T.

The following characteristic values are chosen:
Tck=1/fck=5 ns or 10 ns
Cint=50 fF; Rp=10 MOhm hence $\tau$ =500 ns
with Ce=1 pF, the result is Re=500 kOhm.

If the value Ce is chosen to be 1 pF, a kT/C noise equal to 130e- can be obtained which is negligible in the quadratic sum in comparison with the equivalent noise load of the charge preamplifier, between 350e- and 650e-, and the measured consumption for a clock frequency f=200 MHz is less than 20 mW.

The configuration of the switching circuit makes it possible to obtain delays varying from 25 ns to 50 ns with a clock period of 5 ns, using the chosen values. By increasing the clock period to 10 ns, the conversion device thus made can give delays varying from 45 ns to 95 ns. Much longer delays can be obtained by increasing the clock period and/or modifying the configuration of the switching device.

In this example, the device is adapted to microelectronic integration in which its size 400×600 μm² in a current 0.35 μm CMOS technology is consistent with the size of the other functions.

In one embodiment, the device for conversion disclosed above is integrated into an ionising electromagnetic radiation detection system.

Figure 9:
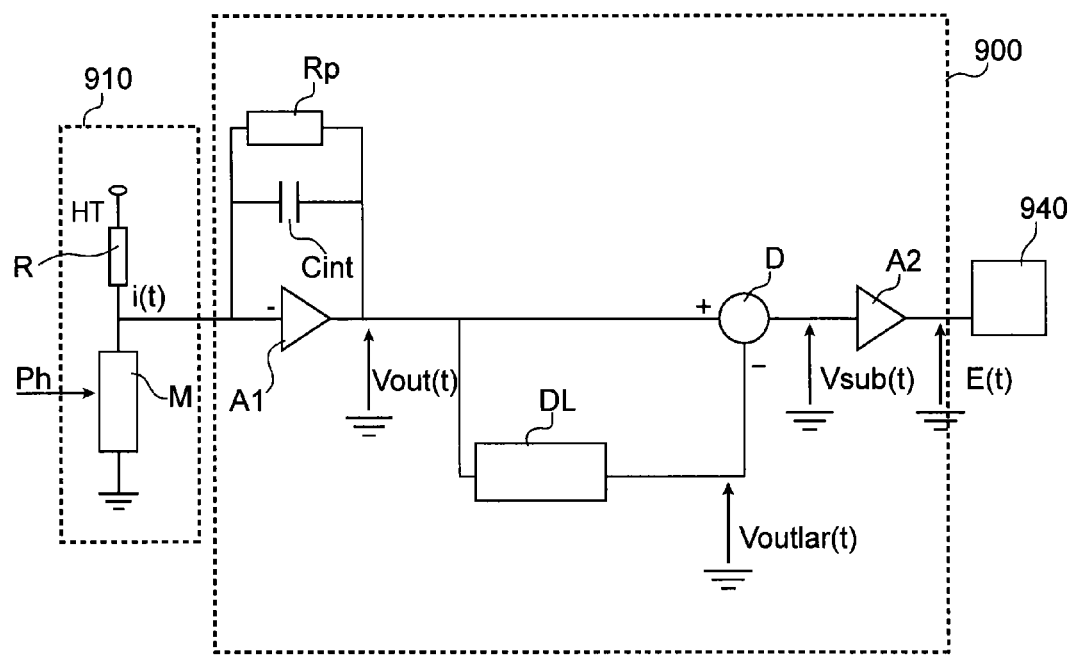
FIG. 9 shows a block diagram of a system for detection of ionising electromagnetic radiation using the pulse conversion device shown in FIG. 5A.

More precisely, FIG. 9 shows a mimic diagram of the ionising electromagnetic radiation detection system according to one embodiment of the invention.

According to the invention, the system comprises a semiconductor detector 910. The detector 910 comprises an element made of semiconductor material M, for example such as a CdZnTe detector, a CdTe:Cl detector or a CdTe:In detector and a resistor R that connects the element M to a high voltage HV. The output from the semiconductor detector 910 is connected to a device for conversion of current pulses into voltage pulses 900 like that described with reference to FIG. 5A.

An analogue-digital converter 940 is connected to the output from the device for conversion of current pulses into voltage pulses 900 and it receives voltage pulses E(t).

Preferably, the analogue-digital converter 940 and the counter of the conversion device 900 are synchronised by the same clock. This facilitates sampling of signals at the analogue-digital converter 940.

Those skilled in the art will understand that a system for detection of ionising electromagnetic radiation can be made in the same way starting from the device for conversion of current pulses into voltage pulses shown in FIG. 5B.

The ionising electromagnetic radiation detection system will find applications particularly to the use of spectrometry for the measurement of any ionising radiation, and particularly X radiation or gamma radiation, especially if said radiation is intense.

It may be used for the detection of explosives in luggage. Apart from luggage control, this device can be used in applications in the nuclear field, for example for measurement of the activity of waste or fuel.

The invention claimed is:

1. A device for conversion of current pulses into voltage pulses, comprising:
    an integrator circuit comprising a first capacitor and a first resistor placed in parallel between an output and an inverting input of an operational amplifier, the inverting input to the operational amplifier receiving the current pulses;
    a delay line receiving the output from the integrator circuit and generating a delay, wherein the delay line comprises at least one memory cell, the at least one memory cell comprising:
        a second capacitor and a second resistor mounted in parallel, the product of a resistance of the first resistor and a capacitance of the first capacitor being equal to the product of a resistance of the second resistor and a capacitance of the second capacitor;
        a write switch connected to a first common node to the second capacitor and the second resistor, configured to charge the second capacitor from an output from the integrator circuit when the write switch is conducting and storing a voltage at terminals of the second capacitor when the write switch is in high impedance;
        a read switch connected to the first common node and configured to read a voltage of the first common node when the read switch is conducting;
    and further comprising a subtractor configured to subtract the voltage stored at the terminals of the second capacitor from the output from the integrator circuit and provide a voltage difference thus obtained.

2. A device for conversion of current pulses into voltage pulses according to claim 1, wherein the second capacitor and the second resistor are connected to a second common node connected at the output from the integrator circuit, and the write switch directly connects the first common node to ground when the write switch is conducting.

3. A device for conversion of current pulses into voltage pulses according to claim 1, further comprising circuitry configured to send to each of the memory cells in sequence, a first signal to the write switch and a second signal to the read switch, the second signal being offset in time from the first signal, and the time offset being defined as a function of delay.

4. A device for conversion of current pulses into voltage pulses according to claim 1, wherein the delay is longer than a rise time of a signal at an output from the integrator circuit.

5. A device for conversion of current pulses into voltage pulses according to claim 1, integrated into an application specific integrated circuit (ASIC).

6. A device for conversion of current pulses into voltage pulses according to claim 1, made using a CMOS technology.

7. A system for detection of ionizing electromagnetic radiation, comprising:
 an ionizing electromagnetic radiation detector configured to receive incident photons and emitting current pulses at an output;
 a device for conversion of current pulses into voltage pulses according to claim 1, connected to an output from the detector; and
 a digital-analog converter at an output from the device for conversion of current pulses into voltage pulses.

8. A system for detection of ionizing electromagnetic radiation according to claim 7, wherein the ionizing electromagnetic radiation detector is a semiconductor detector.

9. A device for conversion of current pulses into voltage pulses, comprising:
 an integrator circuit comprising a first capacitor and a first resistor placed in parallel between an output and an inverting input of an operational amplifier, the inverting input to the operational amplifier receiving the current pulses;
 a delay line receiving the output from the integrator circuit and generating a delay, wherein the delay line comprises at least one memory cell, the at least one memory cell comprising:
  a second capacitor and a second resistor mounted to a common node that is configured to be directly connected to the output from the integrator circuit by a write switch, the product of a resistance of the first resistor and a capacitance of the first capacitor being equal to the product of a resistance of the second resistor and a capacitance of the second capacitor;
  the write switch connected to the common node to the second capacitor and the second resistor, configured to charge the second capacitor from an output from the integrator circuit when the write switch is conducting and storing a voltage at terminals of the second capacitor when the write switch is in high impedance;
  a read switch connected to the common node and configured to read a voltage of the common node when the read switch is conducting;
 and further comprising a subtractor configured to subtract the voltage stored at the terminals of the second capacitor from the output from the integrator circuit and provide a voltage difference thus obtained.

10. A device for conversion of current pulses into voltage pulses according to claim 9, wherein the write switch connects the common node to the output from the integrator circuit when the write switch is conducting, and the read switch connects the common node to a negative input to the subtractor when the read switch is conducting, the output from the integrator circuit being connected to a positive input to the subtractor.

11. A device for conversion of current pulses into voltage pulses according to claim 10, wherein the second capacitor is placed between the common node and a first reference potential and the second resistor is placed between the common node and a second reference potential.

12. A device for conversion of current pulses into voltage pulses according to claim 11, wherein the second reference potential is equal to a continuous potential of the inverting input to the operational amplifier.

13. A device for conversion of current pulses into voltage pulses according to claim 9, further comprising circuitry configured to send to each of the memory cells in sequence, a first signal to the write switch and a second signal to the read switch, the second signal being offset in time from the first signal, and the time offset being defined as a function of delay.

14. A device for conversion of current pulses into voltage pulses according to claim 9, wherein the delay is longer than a rise time of a signal at an output from the integrator circuit.

15. A device for conversion of current pulses into voltage pulses according to claim 9, integrated into an application specific integrated circuit (ASIC).

16. A device for conversion of current pulses into voltage pulses according to claim 9, made using a CMOS technology.

17. A system for detection of ionizing electromagnetic radiation, comprising:
 an ionizing electromagnetic radiation detector configured to receive incident photons and emitting current pulses at an output;
 a device for conversion of current pulses into voltage pulses according to claim 9, connected to an output from the detector; and
 a digital-analog converter at an output from the device for conversion of current pulses into voltage pulses.

18. A system for detection of ionizing electromagnetic radiation according to claim 17, wherein the ionizing electromagnetic radiation detector is a semiconductor detector.

* * * * *